United States Patent [19]

Ahmad et al.

[11] Patent Number: 5,716,862

[45] Date of Patent: Feb. 10, 1998

[54] HIGH PERFORMANCE PMOSFET USING SPLIT-POLYSILICON CMOS PROCESS INCORPORATING ADVANCED STACKED CAPACITOR CELLS FOR FABRICATING MULTI-MEGABIT DRAMS

[75] Inventors: Aftab Ahmad; Randhir P. S. Thakur; Kirk Prall; Tyler Lowrey; Brett Rolfson, all of Boise, Id.

[73] Assignee: Micron Technology, Inc., Boise, Id.

[21] Appl. No.: 491,179

[22] Filed: Jun. 16, 1995

Related U.S. Application Data

[63] Continuation-in-part of Ser. No. 67,660, May 26, 1993, Pat. No. 5,425,392.

[51] Int. Cl.[6] .................. H01L 21/265; H01L 21/02; H01L 21/70; H01L 27/00

[52] U.S. Cl. .................. 437/41; 437/35; 437/52; 437/238

[58] Field of Search .................. 437/41 SW, 40 SW, 437/52, 238, 35

[56] References Cited

U.S. PATENT DOCUMENTS

| 4,567,058 | 1/1986 | Koh | 437/173 |
|---|---|---|---|
| 4,683,144 | 7/1987 | Nishimura et al. | 437/173 |
| 4,843,030 | 6/1989 | Eden et al. | 437/173 |
| 4,912,065 | 3/1990 | Mizumo et al. | 437/173 |
| 4,957,777 | 9/1990 | Ilderem et al. | 437/200 |
| 5,011,789 | 4/1991 | Burns | 437/81 |
| 5,025,741 | 6/1991 | Suwanai | 437/919 |
| 5,057,447 | 10/1991 | Paterson | 437/200 |
| 5,330,935 | 7/1994 | Dobuzinsky et al. | 437/239 |
| 5,382,533 | 1/1995 | Ahmad et al. | 437/242 |
| 5,405,791 | 4/1995 | Ahmad et al. | 437/34 |
| 5,425,392 | 6/1995 | Thakur et al. | 437/173 |
| 5,470,777 | 11/1995 | Nagata et al. | 437/41 SW |
| 5,573,965 | 11/1996 | Chen et al. | 437/41 SW |

FOREIGN PATENT DOCUMENTS

| 0045923 | 3/1982 | Japan | 437/165 |
|---|---|---|---|
| 0050428 | 3/1982 | Japan | 437/165 |
| 1220431 | 9/1989 | Japan . | |
| 0222527 | 9/1990 | Japan . | |

OTHER PUBLICATIONS

Ghandhi, "VLSI Fabricaton Principles", John Wiley & Sons, 1983, pp. 591–592.

Woff "Silicon Processing for VLSI Era", Lattice Press, 1986 pp. 50–58, 161–182.

Mayo, "Photodeposition Enhancement of Deposition by Heal and Light" Solid State Technology, 1986 pp. 141–1986.

*Primary Examiner*—Brian Dutton

[57] ABSTRACT

This invention is a process for manufacturing dynamic random access memories using stacked container capacitor cells in a split-polysilicon CMOS manufacturing flow. The split-polysilicon flow denotes that N-channel and P-channel transistor gates are formed from a single conductive layer (typically a doped polysilicon layer) using separate masking steps. In one embodiment of the present invention teaches a semiconductor manufacturing process for forming p-channel devices by the steps of: defining p-channel transistor gate electrodes having substantially vertical sidewalls over n-well regions; performing a p-type impurity implant into the n-well regions to form p-channel source and drain terminals on opposing sides of each the p-channel transistor gate electrodes; performing an angled n-type impurity implant into the n-well regions to form an n-type halo around the p-channel source and drain terminals; performing a low temperature oxidation step at a temperature ranging between 600°–957° C., to form poly gate sidewall oxidation about the vertical sidewalls of the p-channel transistor gate electrodes; and performing a p-type impurity implant into the n-well regions.

14 Claims, 10 Drawing Sheets

HIGH PERFORMANCE PMOSFET USING SPLIT-POLYSILICON CMOS PROCESS INCORPORATING ADVANCED STACKED CAPACITIOR CELLS FOR FABRICATING MULTI-MEGABIT DRAMS

Cross-Reference to Related Applications

This application is a continuation-in-part to application, Ser. No. 08/067,660, filed May 26th, 1993, now U.S. Pat. No. 5,425,392 hereby incorporated by reference.

This application is related to copending application, Ser. No. 08/322,807, filed Oct. 15, 1993, hereby incorporated by reference.

FIELD OF THE INVENTION

This invention relates to integrated circuit manufacturing technology and, more specifically, to a process for isolating transistor gates.

BACKGROUND OF THE INVENTION

The business of producing dynamic random access memory (DRAM) devices is a very competitive, high-volume business. Process efficiency and manufacturability, as well as product quality, reliability, and performance are the key factors that determine the economic success of such a venture.

Each cell within a DRAM device, an individually-addressable location for storing a single bit of digital dam, is comprised of two main components: a field-effect access transistor and a capacitor. As component density in memory chips has increased, it has been necessary to at least maintain cell capacitance as cell size shrinks. Each new generation of DRAM devices generally has an integration level that is four times that of the generation which it replaced. Such a quadrupling of device number per chip is normally accompanied by a decrease in device geometries. All DRAM memories of 4-megabit and greater density utilize cell designs having three-dimensional capacitors. Although both trench and stacked capacitor designs have proven serviceable at the 4-megabit level, most manufacturers now seem to favor the stacked capacitor design for its manufacturability and somewhat higher yield.

Most current-generation dynamic random access memories (DRAMs) utilize CMOS technology. Although the term "CMOS" is an acronym for (C)omplementary (M)etal (O)xide (S)emiconductor, the term CMOS is now more loosely applied to any integrated circuit in which both N-channel and P-channel field-effect transistors are used in a complementary fashion. Although CMOS integrated circuit devices are often referred to as "semiconductor" devices, such devices are fabricated from various materials which are either electrically conductive, electrically non-conductive or electrically semiconductive. Silicon, the most commonly used semiconductor material can be made conductive by doping it (introducing an impurity into the silicon crystal structure) with either an element such as boron which has one less valence electron than silicon, or with an element such as phosphorus or arsenic which have one more valence electron than silicon. In the case of boron doping, electron "holes" become the charge carriers and the doped silicon is referred to as positive or P-type silicon. In the case of phosphorus or arsenic doping, the additional electrons become the charge carriers and the doped silicon is referred to as negative or N-type silicon. If a mixture of dopants having opposite conductivity types is used, counter doping will result, and the conductivity type of the most abundant impurity will prevail. Silicon is used either in single-crystal or polycrystalline form. Polycrystalline silicon is referred to hereinafter as "polysilicon" or simply as "poly". Although polysilicon has largely replaced metal for the MOS device gates, the relatively low conductivity of that material (even when heavily doped) has led many semiconductor manufacturers to create a layer of refractory metal silicide on transistor gates in order to decrease sheet resistance and, thereby, increase device speed. In conventional DRAM processes, two additional poly layers are used for the lower and upper cell capacitor plates.

CMOS manufacturing processes generally begin with a lightly-doped P-type or N-type silicon substrate, or lightly-doped epitaxial silicon on a heavily doped substrate. Although P-type silicon is usually chosen as the starting material, selection of N-type silicon as the starting material changes the process very little, the primary difference being that for a given step, dopant types are reversed.

Triple polysilicon layer manufacturing processes for contemporary stacked-capacitor dynamic random access memories require some fourteen to eighteen masking steps. As device geometries shrink, each photolithographic step becomes more costly. In light of the costs associated with masking operations, manufacturing processes which permit a significant reduction in the number of masking operations are greatly preferred.

What is needed, therefore, is split-polysilicon CMOS DRAM technology which permits P-channel processing late in the process flow without using an additional mask and therefore minimizes subsequent thermal cycles and allows for better short channel characteristics. Since p-channel FETs commonly use boron for the source/drain implants (boron has a very high diffusivity rate during thermal cycles), less thermal cycles will result in very robust PMOS-FETs.

SUMMARY OF THE INVENTION

An embodiment of the present invention teaches a semiconductor manufacturing process for forming insulated transistor gates by performing a temperature controlled insulation step (preferably at a temperature ranging between 600°–957° C.), to form transistor gate insulation about the sidewalls of each transistor gate.

Another embodiment further enhances the present invention by forming a fluorinated barrier along the transistor gate and extending to the transistor's diffusion region.

BRIEF DESCRIPTION OF THE DRAWINGS

FIG. 3 is a cross-sectional view of the portion of the in-process memory of FIG. 2 following reoxidation of the FIG. 4 is a cross-sectional view of the portion of the in-process memory of FIG. 3 following an anisotropic etch of the silicon nitride spacer layer to form spacers on the sidewalls of the wordlines and on the sidewall of the unetched expanse of the stacked sandwich layers, an N⁺ source/drain implant, a blanket deposition of a silicon nitride etch stop layer, the primary purpose of which is to cover active areas, the deposition of a boro-phospho-silicate glass (BPSG) layer, and the planarization of the BPSG layer;

EMBODIMENTS OF THE INVENTION

Figure 1:
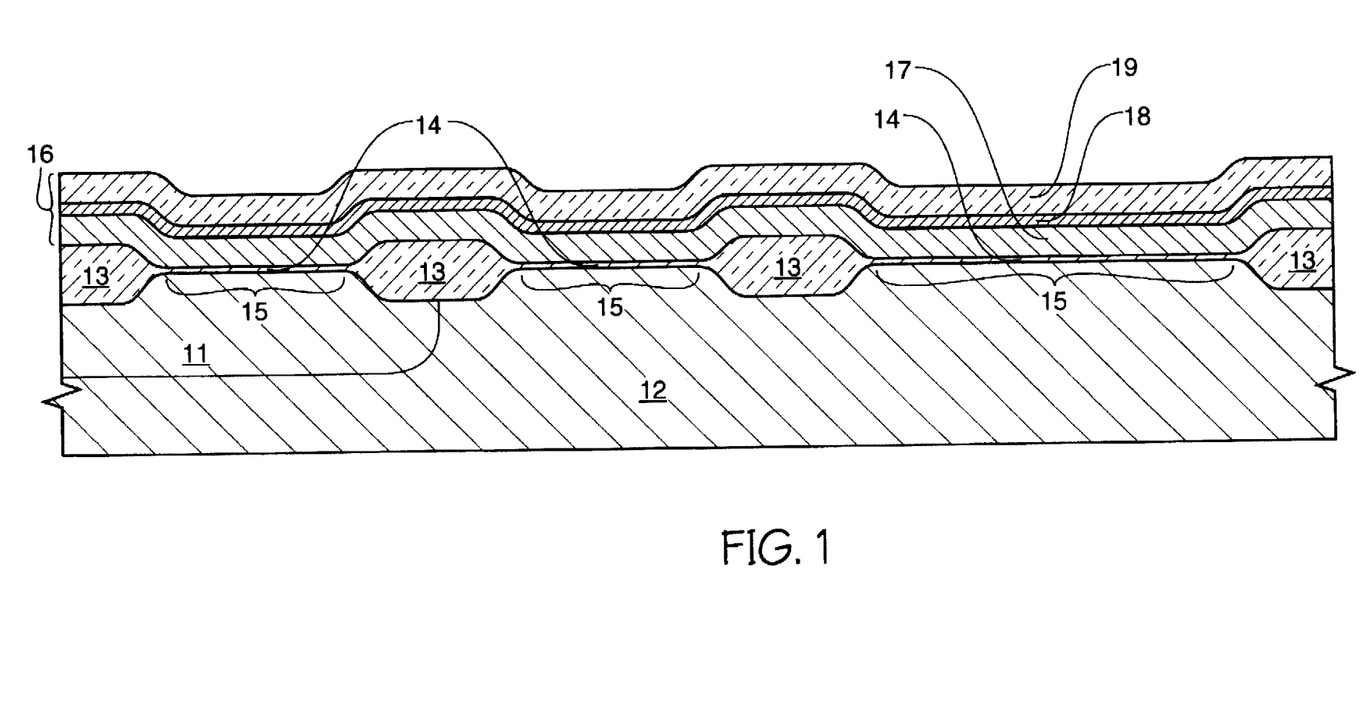
FIG. 1 is a cross-sectional view of a portion of an in-process dynamic random access memory at a stage of manufacture where N-well regions have been formed in a lightly-doped P-type substrate, silicon dioxide field isolation regions have been formed, a gate dielectric layer has been formed on active areas, and a three-layer sandwich, consisting of a first polysilicon layer which is doped to render it conductive, a silicon dioxide buffer layer and a thick silicon nitride layer, has been formed.

Referring now to the cross-sectional view of the in-process DRAM circuitry FIG. 1, N-well regions 11 have been formed in a lightly-doped P-type substrate 12, silicon dioxide field isolation regions 13 have been formed, a gate dielectric layer 14 has been formed on active areas 15, and a three-layer stack 16, consisting of a first conductive layer 17 (in a preferred embodiment of the process, the first conductive layer is either doped polycrystalline silicon or doped or undoped polycrystalline silicon coated with a refractory metal silicide), a silicon dioxide buffer layer 18 and a thick silicon nitride layer 19, has been formed by sequential deposition steps. All transistor gates will be formed from the three-layer stack 16.

Figure 2:
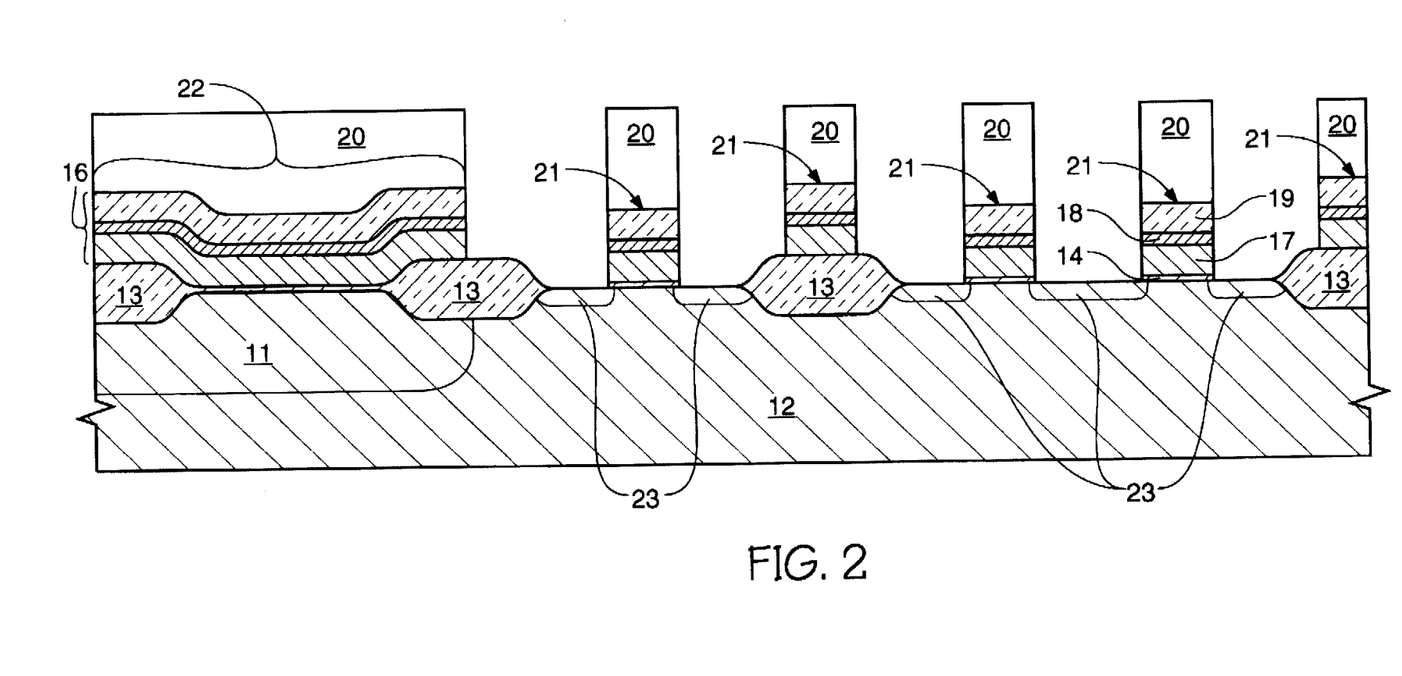
FIG. 2 is a cross-sectional view of the portion of the in-process memory of FIG. 1 following the patterning of the three-layer sandwich to form a series of wordlines in the N-channel region and an unetched expanse in the P-channel region (i.e., the N-well region)

Referring now to FIG. 2, the three-layer stack 16 of FIG. 1 has been patterned and etched by use of photoresist 20 to form a series of wordlines 21 in the N-channel region and an unetched three-layer expanse 22 in the P-channel region (i.e., the N-well region 11). The unetched three-layer expanse 22 is the distinguishing characteristic of a "split-polysilicon" CMOS DRAM process. At this point in the process, N-channel source/drain regions 23 are formed by implanting light doses of arsenic or phosphorous (N⁻) to form lightly doped drains (LDD).

Figure 3:
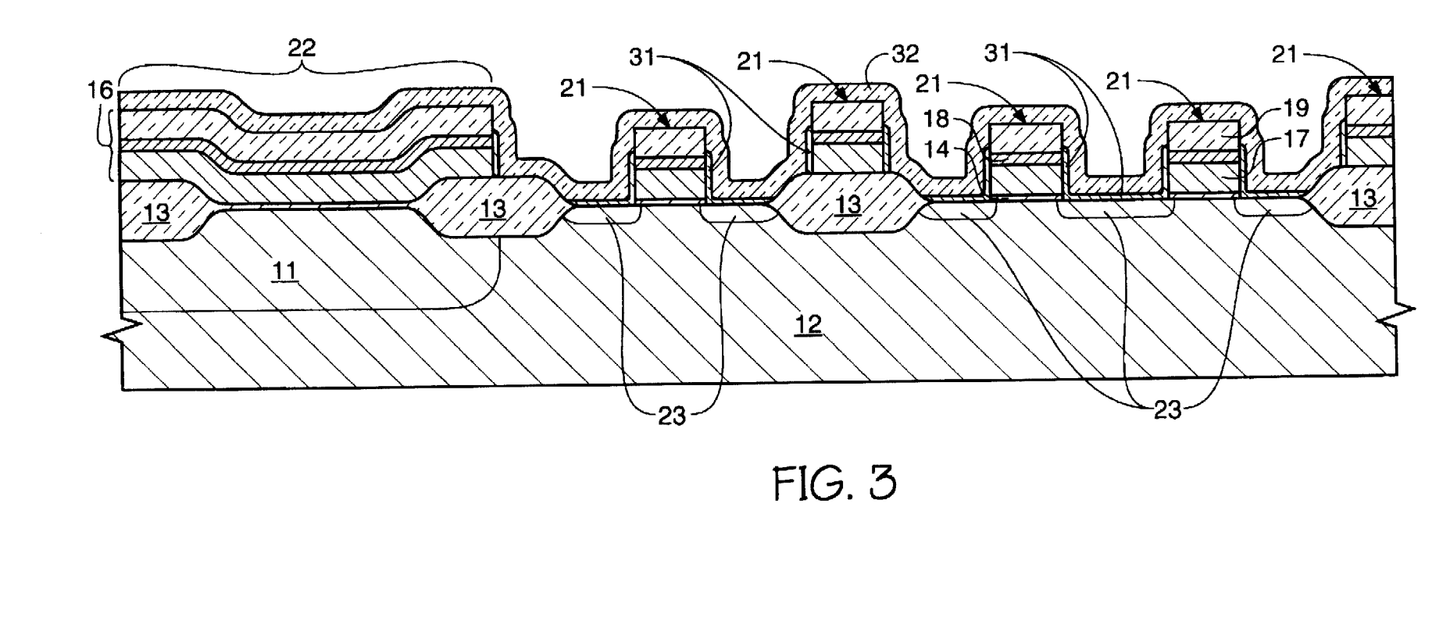

Referring now to FIG. 3, after the photoresist 20 (seen in FIG. 2) has been stripped, N-channel source/drain regions 23 are reoxidized which also results in the formation of oxide sidewall spacers 31 about the patterned edges of conductive layer 17. Next, a silicon nitride spacer layer 32 is deposited over all in-process circuitry.

Figure 4:
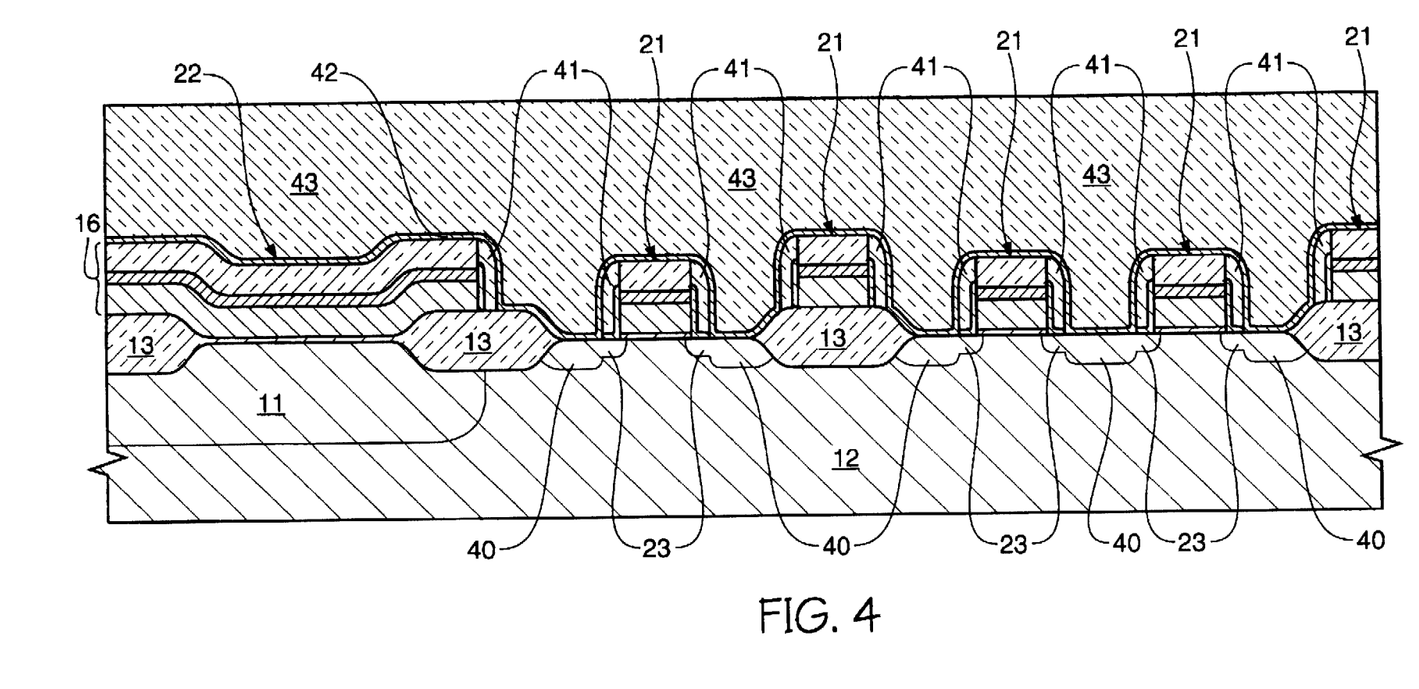

Referring now to FIG. 4, the silicon nitride spacer layer 31 has been anisotropically etched to form spacers 41 on the sidewalls of the wordlines 21 and on the sidewalls of the unetched expanse 22. The anisotropic etch is terminated at the point where the spacers 41 cover the edges of all three layers of each remnant of the sandwich 16. Following the formation of spacers an arsenic N⁺ implant is performed to form deeper diffusion regions 40 and a silicon nitride etch-stop layer 42 is deposited over all in-process circuitry. Following the deposition of the etch-stop layer 42, a thick insulative mold layer 43 is deposited on top of the etch-stop layer 42. Boro-phospho-silicate glass is deemed to be the preferred dielectric material from which the mold layer 43 is formed. After the mold layer 43 is deposited, it is planarized. Although a number of planarization techniques are known in the art, chemical mechanical planarization is deemed to be the preferred method. FIG. 4 represents the departing point for two distinct variations of the process. Thus, the process continues with FIGS. 5a or 5b.

Figure 5A:
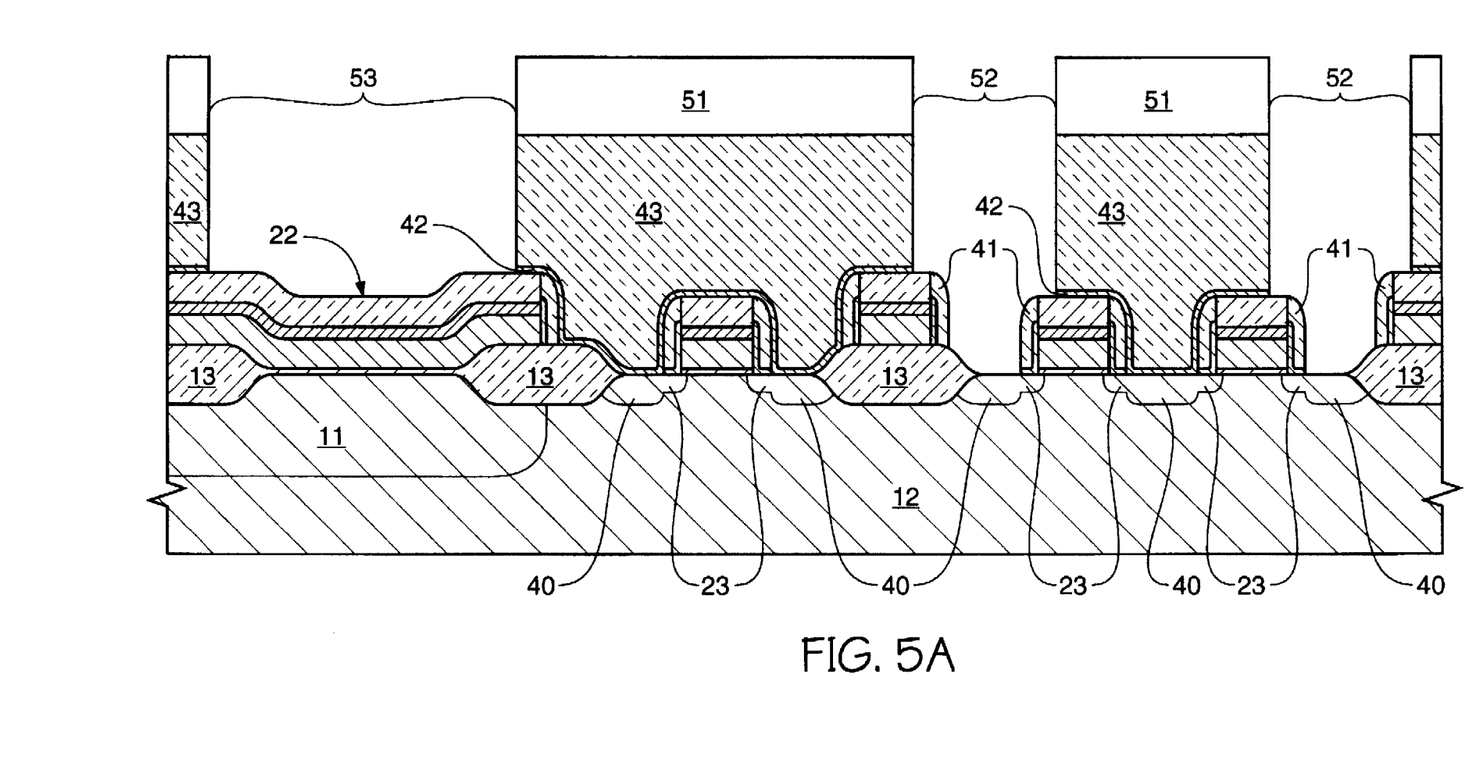
FIGS. 5a and 5b are cross-sectional views of the portion of the in-process memory of FIG. 4 following the patterning and etching of the BPSG layer to form storage node contact openings.

Referring now to FIG. 5a, mold layer 43 has been patterned with a contact photoresist mask 51, and etched to form storage node contact openings 52, and to also remove those portions of the mold layer 43 that are superjacent the P-channel (N-well) region, thus creating a recessed region 53 in the mold layer 43 above the unetched expanse 22.

Figure 5B:
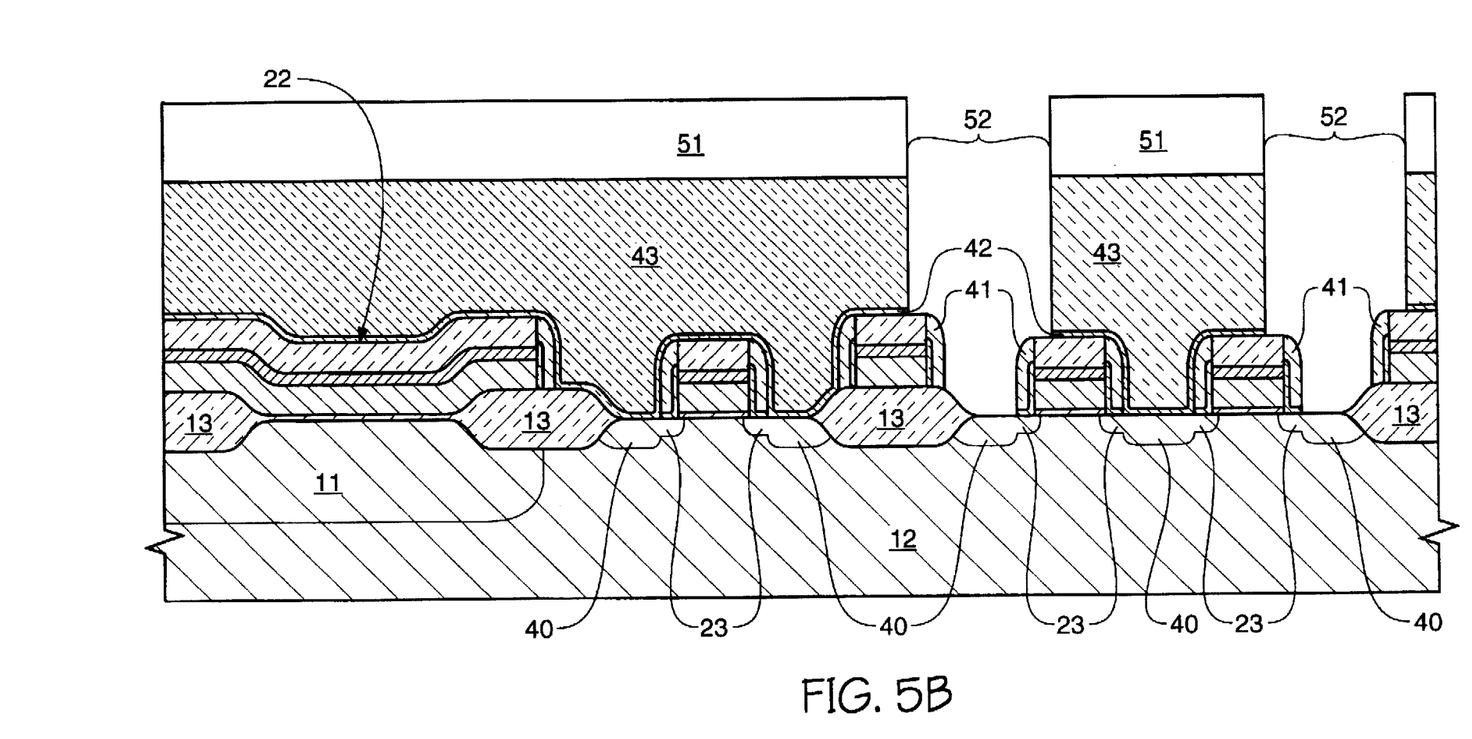

Alternatively, as shown in FIG. 5b, mold layer 43 has been patterned with a contact photoresist mask 51, and etched to form storage node contact openings 52, however using this option, mold layer 43 is also masked off so that the periphery regions remain covered with mold layer 43. This region can later be patterned after cell formation (FIGS. 6–8) in order to define the p-channel devices. During cell formation mold layer 43 would be thinned down to bring the stack height to minimum which provides a better angle when the p-channel devices are patterned. Once cell formation is completed and the p-channel devices patterned, the processing steps would continue as described later in FIGS. 9–11.

Figure 6:
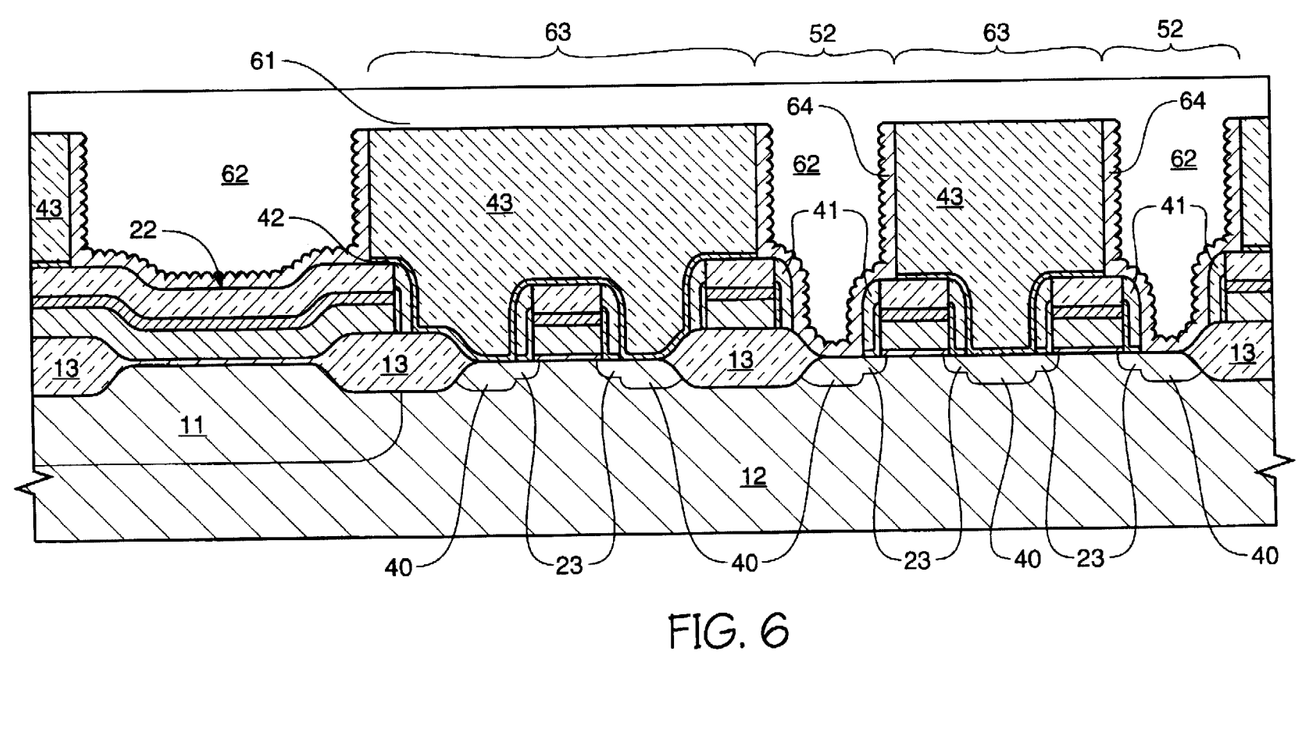
FIG. 6 is a cross-sectional view of the portion of the in-process memory of FIG. 5 following the deposition of a second polysilicon layer and chemical-mechanical planarization of the resulting structure.

Referring now to FIG. 6, a second conductive layer 61 is blanket deposited (i.e., such that it covers all in-process circuitry). As a capacitance enhancing feature, the second conductive layer 61 is preferably doped hemispherical gain (HSG) silicon. Doping may occur in-situ during deposition, or it may occur subsequent to deposition. The polysilicon-lined N-well region and contact openings are then optionally filled with a filler material 62, such as photoresist or spin-on glass. The resulting structure is then planarized, preferably using chemical-mechanical planarization in order to remove horizontal portions 63 of the second polysilicon layer 61. The remaining portions of the second polysilicon layer 61 fill the recess in the mold layer 43 above the N-well and the storage-node contact openings 51. The latter portions will function as the storage-node capacitor plate 64.

Figure 7:
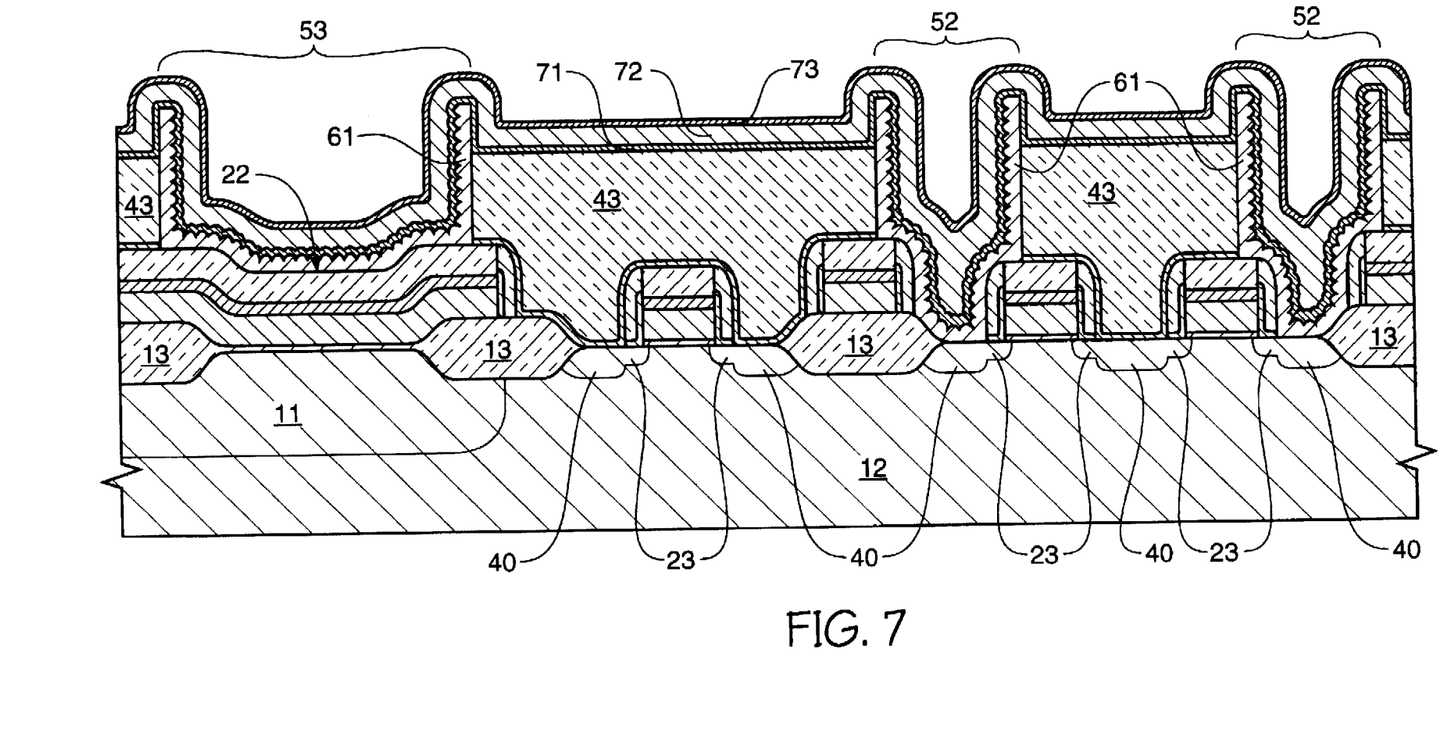
FIG. 7 is a cross-sectional view of the portion of the in-process memory of FIG. 6 following an etch back of the thick insulative layer, deposition of a cell dielectric layer, deposition of a cell plate layer, and optional deposition of silicon nitride capping layer.

Referring now to FIG. 7, the filler material 62 has been removed and the mold layer 43 is thinned during an etch-back step until portions of the second conductive layer 61 which line both the recesses above the unetched three layer expanse 22, and the storage-node contact openings 51 extend above the surface of the mold layer 43. A cell dielectric layer 71 is then formed on at least the exposed surfaces of the remnants of the second polysilicon layer 61. In a preferred embodiment of the process, the cell dielectric layer is a silicon dioxide-silicon nitride-silicon dioxide sandwich, and the silicon nitride layer of this sandwich is blanket deposited via chemical vapor deposition. Following the formation of a cell dielectric layer 71, a conductive cell plate layer 72 is formed on top of the cell dielectric layer 71. In a preferred embodiment of the process, the cell plate layer 72 is also a layer of doped polysilicon. A silicon nitride etch stop layer 73 is then deposited on top of the cell plate layer 72.

Figure 8:
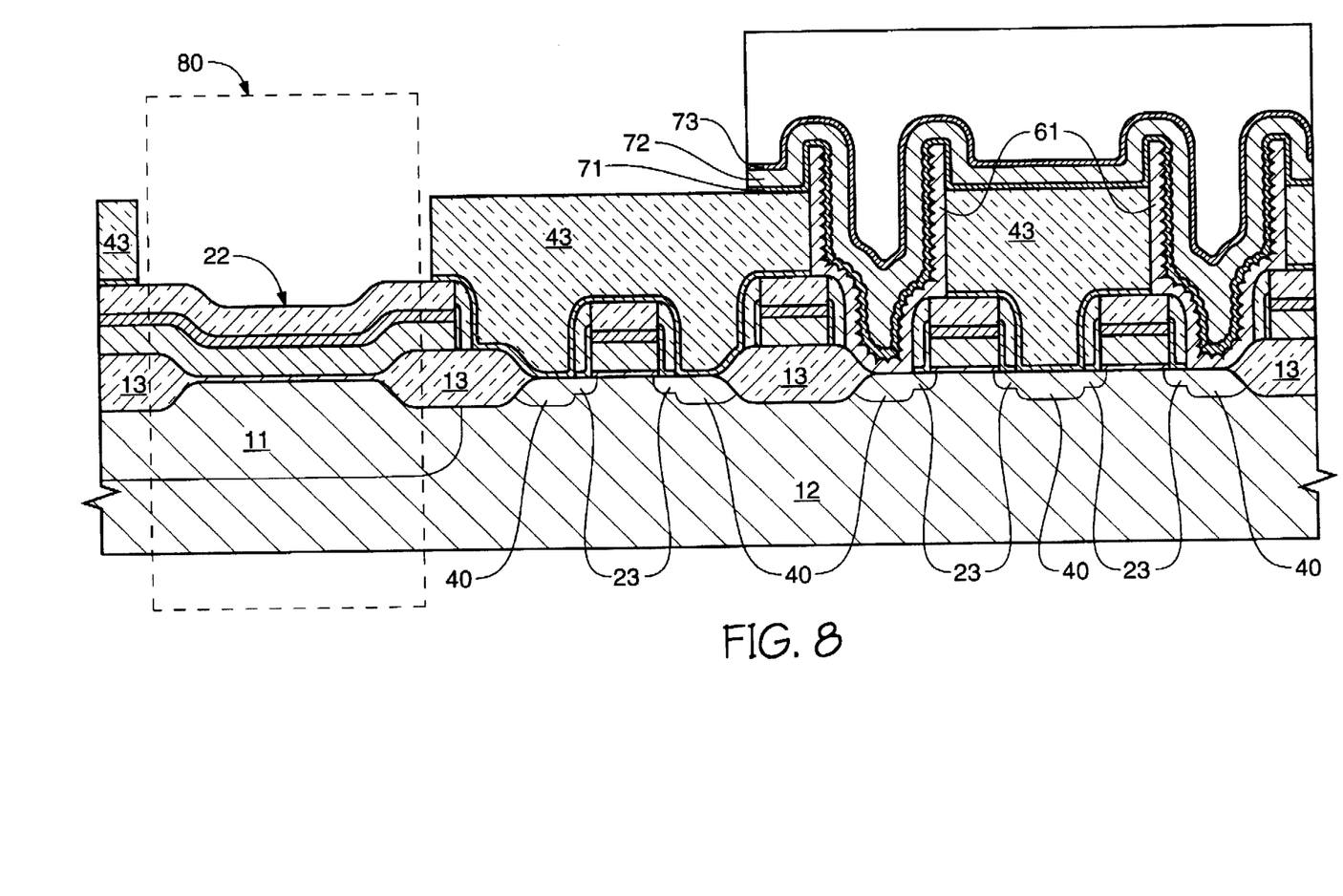
FIG. 8 is a cross-sectional view of the portion of the in-process memory of FIG. 7 following removal of capacitive layers from all but the cell array region.

Referring now to FIG. 8, the capacitive layers (the second conductive layer 61, the cell dielectric layer 71, and the cell plate layer 72) are removed from all but the cell array region through the use of a series of selective etch steps, thus exposing the mold layer 43. The mold layer 43 is then thinned to a level that exposes the upper surface of the unetched three-layer expanse 22, yet does not expose the source/drain regions of N-channel transistors that will be formed in region 80 that is peripheral to the cell array.

Figure 9:
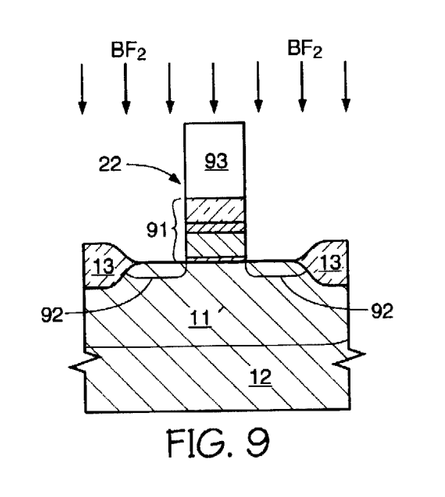
FIG. 9 is a cross-sectional view of the periphery portion 80 of the in-process memory of FIG. 8 following masking of the N-channel region (not shown), and patterning and etching of the unetched expanse of sandwich layers in the P-channel region 80, a photoresist strip, and a P-channel source/drain implant.

Referring to FIG. 9, following the masking of the entire N-channel region with photoresist 93, and the masking of the unetched three-layer expanse 22 to provide a mask pattern for P-channel device gates, the in-process circuitry is etched to form those P-channel device gate electrode 91. Also in FIG. 9, after P-channel device gate 91 is formed P-channel source/drain regions 92 are formed with a blanket boron-difluoride implant into n-well region 11 and on opposing sides of p-channel gate electrode 91.

Figure 10:
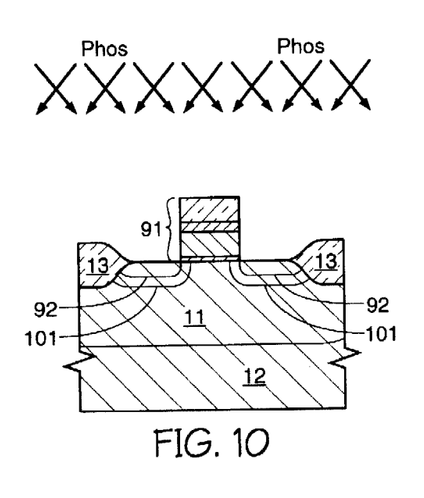
FIG. 10 is a cross-sectional view of the portion of the in-process periphery portion of FIG. 9 following a phosphorus angled implant.

Referring now to FIG. 10, after removing photoresist 93, seen in FIG. 9, a phosphorus halo angled implant is performed using all four angle orientations as shown. This implant forms a halo 101 of n-type impurities around P-channel source/drain regions 92. This n-type halo prevents punch through of depletion regions at higher drain voltages and enhances the short channel effects and robust transistor characteristics.

Figure 11:
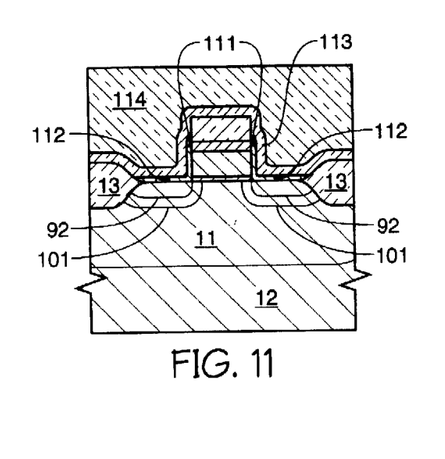
FIG. 11 is a cross-sectional view of the portion of the in-process periphery portion of FIG. 9 following a photoresist strip, an ozone oxidation step, forming of a conformal non-conductive layer and the forming of a blanking insulating layer.

Referring now to FIG. 11, an ozone oxidation step is performed to form ozone silicon dioxide spacers 111 about the vertical conductive portion (polysilicon 17) of gate 91 and to form a ozone silicon dioxide layer 112 that will insulate source/drain regions 92 from a subsequently formed conductive layer. The purpose of this ozone oxidation step on the PMOSFETs gates is twofold. First, due to ozone's low temperature characteristics, fewer thermal cycles are used and thus the P+ boron does not diffuse into the channel region as readily (short channel characteristics are enhanced). Second, curing the thin gate oxide region with low temperature oxidation for any plasma damage due to the process of patterning the PMOSFETs gates.

One aspect of the present invention is a low temperature oxidation process for fabricating thin oxide layers comprising growing a the gate oxide sidewall spacers in an ozone-containing atmosphere, which atmosphere is generated at a temperature substantially in the range of 600° C. to 957° C. including all temperatures and temperature ranges assumed therein. The preferred temperature range is 750° C. to 907° C.

Oxidation in the presence of ozone dramatically increases the oxidation rate over dry oxidation. The faster oxidation rates permit the use of the lower oxidation temperatures, which in ram, result in less stress, reduced electrical encroachment, and a reduced amount of enhancement dose of dopant. The reduced enhancement doping is very much needed to maintain short channel characteristics.

After this ozone oxidation step, a conformal non-conductive layer 113 is formed to cover gate 91, source/drain regions 92 and field oxide regions 13. Finally, the entire structure is covered with an insulating layer 114, such as BPSG. The device is then completed using process steps as dictated by the manufacturing process being used.

Figure 12:
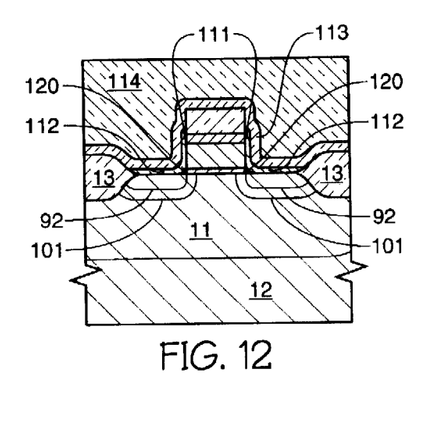
FIG. 12 is a cross-sectional view of the portion of the in-process periphery portion of FIG. 9 after forming an optional fluorinated barrier layer about the transistor gates.

Optionally and referring now to FIG. 12, a fluorinated barrier layer 120 is formed along the gate sidewalls and extends to the diffusion regions 92 to further enhance the gate sidewall oxidation.

Although only several embodiments of the new process have been disclosed herein, it will be obvious to those having ordinary skill in the art that modification and changes may be made thereto without departing from the spirit and the scope of the process as hereinafter claimed. For example, though the process teaches the development of a DRAM memory device, the concepts shown in FIGS. 11 and 12 depict a general concept of the present invention in that the insulated transistor gates can be used for any semiconductor device where transistors are used. Furthermore, though FIGS. 11 and 12 show specific diffusion profiles generated by certain implant techniques, they are shown as examples and are not intended to limit the scope of the present invention.

What is claimed is:

1. A process for forming an insulated transistor gate in a semiconductor device comprising:

performing a temperature controlled insulation step to form transistor gate insulation on at least one sidewall of said transistor gate, said temperature controlled insulation step comprising an ozone oxidation step performed at a temperature ranging between 600°–957° C.

2. The process of claim 1, wherein said temperature controlled insulation step further comprises ultraviolet radiation and an ozone/oxygen gas mixture.

3. The process of claim 1, wherein said temperature controlled insulation step further comprises using ozone in oxygen, said oxygen comprising an ozone concentration of approximately 1–20%.

4. The process of claim 1, wherein said transistor gate is formed for a Field Effect Transistor (FET).

5. The process of claim 4, wherein said FET is a p-channel transistor.

6. The process of claim 4, wherein said FET is an n-channel transistor.

7. The process of claim 1, wherein said semiconductor device is a dynamic random access memory device.

8. A process for forming a transistor device in a semiconductor device comprising the steps of:

defining a transistor gate over a conductive well region, said transistor gate having sidewalls;

performing an impurity implant into said conductive well region to form source and drain regions on opposing sides of said transistor gate; and performing an oxidation step at a temperature ranging between approximately 600°–957° C., to form oxidation on said sidewalls of said transistor gate, said oxidation step comprising ozone oxidation.

9. The process of claim 8, wherein said oxidation step further comprises ultraviolet radiation and an ozone/oxygen gas mixture.

10. The process of claim 8, wherein said transistor device comprises a Field Effect Transistor (FET).

11. The process of claim 10, wherein said FET is a p-channel transistor.

12. The process of claim 10, wherein said FET is an n-channel transistor.

13. The process of claim 8, wherein said semiconductor device is a dynamic random access memory device.

14. The process of claim 8, wherein said oxidation step further comprises using ozone in oxygen, said oxygen comprising an ozone concentration of approximately 1-20%.

* * * * *